United States Patent
Li et al.

(10) Patent No.: US 10,784,187 B2
(45) Date of Patent: Sep. 22, 2020

(54) ARRAY SUBSTRATE, CHIP ON FILM, DISPLAY PANEL AND DISPLAY DEVICE

(71) Applicant: BOE TECHNOLOGY GROUP CO., LTD., Beijing (CN)

(72) Inventors: Hong Li, Beijing (CN); Liqiang Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 261 days.

(21) Appl. No.: 15/538,712

(22) PCT Filed: Apr. 29, 2016

(86) PCT No.: PCT/CN2016/080646
§ 371 (c)(1),
(2) Date: Jun. 22, 2017

(87) PCT Pub. No.: WO2017/133089
PCT Pub. Date: Aug. 10, 2017

(65) Prior Publication Data
US 2018/0047657 A1  Feb. 15, 2018

(30) Foreign Application Priority Data
Feb. 6, 2016  (CN) .......................... 2016 1 0083954

(51) Int. Cl.
*H01L 23/49*  (2006.01)
*H01L 23/495*  (2006.01)
(Continued)

(52) U.S. Cl.
CPC ...... *H01L 23/49513* (2013.01); *G02F 1/1333* (2013.01); *G02F 1/1362* (2013.01);
(Continued)

(58) Field of Classification Search
CPC ... H01L 23/49513; H01L 27/12; H01L 27/32; H01L 24/09; H01L 24/08; H01L 2224/09;
(Continued)

(56) References Cited

U.S. PATENT DOCUMENTS

2004/0239590 A1 * 12/2004 Kumakura ............. G09G 3/296
345/60
2005/0092994 A1 * 5/2005 Ishige .................... H01L 27/12
257/72
(Continued)

FOREIGN PATENT DOCUMENTS

CN  102346321 A  *  2/2012
CN  203365865 U  * 12/2013
(Continued)

OTHER PUBLICATIONS

International Search Report of PCT/CN2016/080646 in Chinese, dated Nov. 18, 2016 with English translation.
(Continued)

*Primary Examiner* — Charles D Garber
*Assistant Examiner* — S M Sohel Imtiaz
(74) *Attorney, Agent, or Firm* — Collard & Roe, P.C.

(57) ABSTRACT

Provided are an array substrate, a chip on film, a display panel and a display device. The array substrate has a display area and a bonding area located in a periphery of the display area. The array substrate includes a plurality of first bonding pads located in the bonding area, and length directions of the first bonding pads face the display area.

9 Claims, 6 Drawing Sheets

(51) Int. Cl.
    *H01L 27/12*     (2006.01)
    *H01L 27/32*     (2006.01)
    *G02F 1/1362*     (2006.01)
    *G02F 1/1333*     (2006.01)
    *H01L 23/00*     (2006.01)
    *G04B 19/04*     (2006.01)
    *H01L 51/52*     (2006.01)

(52) U.S. Cl.
    CPC .............. *H01L 24/08* (2013.01); *H01L 24/09* (2013.01); *H01L 27/12* (2013.01); *H01L 27/32* (2013.01); *H01L 27/3276* (2013.01); *G04B 19/04* (2013.01); *H01L 51/5203* (2013.01); *H01L 2224/09* (2013.01); *H01L 2224/0912* (2013.01)

(58) Field of Classification Search
    CPC ........... H01L 2224/0912; G02F 1/1333; G02F 1/1362
    See application file for complete search history.

(56) References Cited

U.S. PATENT DOCUMENTS

| | | | | |
|---|---|---|---|---|
| 2006/0290646 | A1* | 12/2006 | Kang | G02F 1/1345 345/100 |
| 2007/0201215 | A1 | 8/2007 | Ito et al. | |
| 2010/0090715 | A1* | 4/2010 | Chang | G02F 1/13458 324/750.01 |
| 2010/0270917 | A1* | 10/2010 | Chuang | G02F 1/13439 313/505 |
| 2012/0049878 | A1* | 3/2012 | Hung | G01R 31/2887 324/756.03 |
| 2014/0059850 | A1* | 3/2014 | Zhou | H05K 3/30 29/832 |
| 2015/0015798 | A1* | 1/2015 | Masuda | G02F 1/1333 348/794 |
| 2015/0201503 | A1* | 7/2015 | Kim | H05K 1/147 29/830 |
| 2015/0208522 | A1* | 7/2015 | Kim | H01L 27/3297 361/749 |
| 2016/0035284 | A1* | 2/2016 | Jung | G06F 1/1637 345/206 |
| 2016/0240141 | A1* | 8/2016 | Lee | G09G 3/3258 |
| 2017/0200780 | A1* | 7/2017 | Im | G09G 3/20 |

FOREIGN PATENT DOCUMENTS

| | | |
|---|---|---|
| CN | 104681507 A | 6/2015 |
| CN | 104780751 A | 7/2015 |
| CN | 204855999 U | 12/2015 |
| CN | 105529338 A | 4/2016 |
| CN | 205406520 U | 7/2016 |
| EP | 1 827 062 A2 | 8/2007 |

OTHER PUBLICATIONS

Notice of Transmittal of the International Search Report of PCT/CN2016/080646 in Chinese, dated Nov. 18, 2016.

Written Opinion of the International Searching Authority of PCT/CN2016/080646 in Chinese, dated Nov. 18, 2016 with English translation.

Chinese Office Action in Chinese Application No. 201610083954.2, dated Jan. 2, 2018 with English translation.

Chinese Office Action in Chinese Application No. 201610083954.2, dated Feb. 19, 2019 with English translation.

* cited by examiner

FIG. 9

ARRAY SUBSTRATE, CHIP ON FILM, DISPLAY PANEL AND DISPLAY DEVICE

CROSS REFERENCE TO RELATED APPLICATIONS

This application is the National Stage of PCT/CN2016/080646 filed on Apr. 29, 2016, which claims priority under 35 U.S.C. § 119 of Chinese Application No. 201610083954.2 filed on Feb. 6, 2016, the disclosure of which is incorporated by reference.

TECHNICAL FIELD

Embodiments of the present disclosure relate to an array substrate, a chip on film, a display panel and a display device.

BACKGROUND

Flat-panel displays are main popular displays at present, and are widely applied to electronic products such as computer screens, mobile phones and the like because of having the characteristics of light and thin appearances, power saving, no radiation, etc.

SUMMARY

An embodiment of the present disclosure provides an array substrate, including a display area and a bonding area located in a periphery of the display area, the array substrate including a plurality of bonding pads located in the bonding area, length directions of the bonding pads facing the display area.

Another embodiment of the present disclosure provides a chip on film, including a central area and a bonding area located in a periphery of the central area, the chip on film including a plurality of second bonding pads located in the bonding area, length directions of the second bonding pads facing the central area.

Yet another embodiment of the present disclosure provides a display panel, including an array substrate and a chip on film, the array substrate including a plurality of first bonding pads, the chip on film including a plurality of second bonding pads, the array substrate and the chip on film being bonded together by the first bonding pads and the second bonding pads, wherein a length direction of the first bonding pads faces a display area of the array substrate, and the plurality of second bonding pads and the plurality of first bonding pads are disposed in a one-to-one correspondence overlapping manner.

Yet another embodiment of the present disclosure provides a display device, including the display panel described above.

BRIEF DESCRIPTION OF THE DRAWINGS

In order to clearly illustrate the technical solution of embodiments of the present disclosure, the drawings of the embodiments will be briefly described in the following; it is obvious that the described drawings are only related to some embodiments of the disclosure and thus are not limitative of the disclosure.

DETAILED DESCRIPTION

In a related art, a display device mainly includes a color filter substrate, an array substrate and a chip on film (COF), wherein the array substrate has a display area for display and a bonding area located in a periphery of the display area, and a end (i.e., a bonding pad) of a lead of the display area is located in the bonding area; a lead and a chip are disposed on a surface of the chip on film; the lead on the chip on film has an end connected to the chip and another end with a bonding pad configured to bond with the bonding pad in the bonding area of the array substrate; and a signal provided by the chip is transmitted to the lead on the array substrate through the lead on the chip on film, such that display is carried out in the display area.

The inventors find that related art has at least the following problems: when the array substrate is a flexible array substrate, that is, a base of the array substrate is often made of a flexible material, for example, an organic material such as PI, PET and the like, when other film layers are formed thereon and when a via hole is formed by etching, deformation of the flexible base is caused. In this case, when the bonding pad on the chip on film and that on the array substrate are bonded, inaccurate alignment and misplacement are easily caused. As a result, the bonding between the two is infirm or a short-circuit phenomenon occurs between adjacent bonding pads.

The technical solutions of embodiments of the present disclosure will be described in a clearly and fully understandable way in connection with the drawings of the embodiments of the present disclosure. It is obvious that the described embodiments are just a part but not all of the embodiments of the disclosure. Based on the described embodiments of the present disclosure herein, those ordinary skilled in the art can obtain all other embodiment(s), without any inventive work, which should be within the scope of the disclosure.

Embodiments of the present disclosure provide an array substrate, a chip on film, a display panel, which are compatible for expansion and shrinkage changes of the array substrate, and a display device.

First Embodiment

In combination with FIGS. 1 to 8, the present embodiment provides a display panel 100, including an array substrate 10 and a chip on film 20. The array substrate 10 has a display area Q1 for display and a bonding area Q2 located in a periphery of the display area Q1. A plurality of first bonding ponds 1 are disposed in the bonding area Q2 of the array substrate 10, and are arranged around the display area Q1. A length direction of the first bonding pad faces the display area Q1. For example, in the present embodiment, each first bonding pad 1 has a rectangular surface, which has a long side and a short side. "A length direction of the first bonding pads faces the display area Q1" means that a line extending along the long side of the rectangular surface of the first bonding pad 1 penetrates through the display area Q1. In another embodiment, each first bonding pad 1 has a strip shape, and an extending direction of the strip shape is the length direction of the first bonding pad 1. Correspondingly, the chip on film 20 includes second bonding pads 20 same as the first bonding pads 1 in an arrangement manner, that is, the second bonding pads 2 are in annular arrangement, and a length direction of the second bonding pads 2 faces a central area Q1 of the annular arrangement. In an example, the plurality of second bonding pads 2 on the chip on film 20 and the plurality of first bonding pads 1 on the array substrate 10 are overlapped in a one-to-one corresponding manner.

In the present embodiment, the first bonding pads 1 on the array substrate 10 and the second bonding pads 2 on the chip on film 20 adopt an annular arrangement manner around the display area Q1, and the length directions thereof face the display area Q1, such that the problem of poor bonding between the first bonding pads 1 and the second bonding pads 2 caused by outward expansion or inward shrinkage deformation of the array substrate in a preparing process can be effectively improved.

In FIGS. 2 to 6, the plurality of first bonding pads 1 schematically represent the array substrate 10, and the plurality of second bonding pads 2 schematically represent the chip on film 20. Therefore, FIGS. 2 to 6 schematically show a display panel 100.

The bonding between the first bonding pads 1 and the second bonding pads 2 in the embodiment of the present disclosure is explained in combination with FIGS. 2 to 6.

Figure 1:
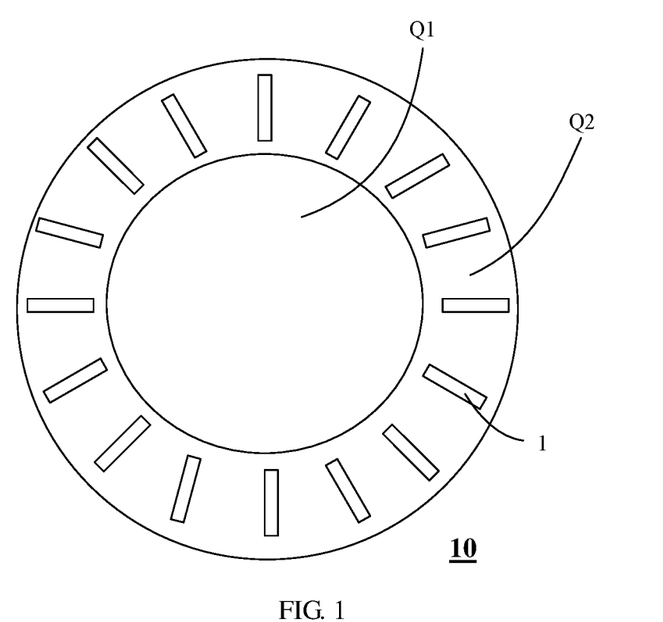
FIG. 1 is a structural schematic diagram of an array substrate according to a first embodiment of the present disclosure.
Figure 2:
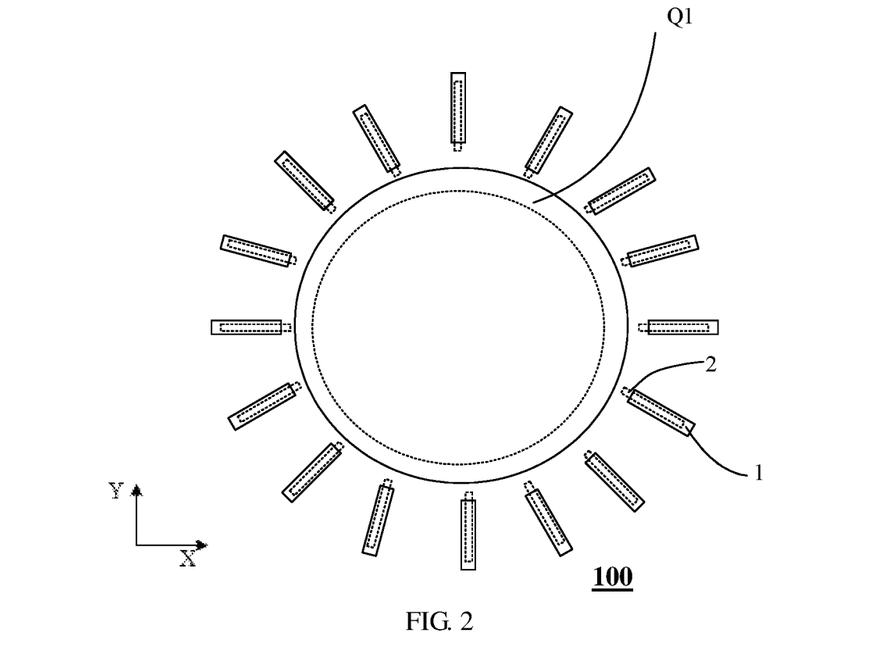
FIG. 2 is a schematic diagram of a position relationship between the array substrate deformed in a first case and a chip on film according to the first embodiment of the present disclosure.

As shown in FIG. 2, in a first case, the array substrate is uniformly deformed; when uniform outward expansion occurs, that is, a part of structures of the first bonding pads 1 on the array substrate are outwards misplaced relative to the second bonding pads 2 on the chip on film, it is seen that the first bonding pads 1 and the second bonding pads 2 are annularly designed and the length directions thereof face the display area, such that the array substrate is uniformly deformed. Therefore, most structures of respective first bonding pads 1 are still bonded with the corresponding second bonding pads 2, thus, the bonding firmness between the first bonding pads 1 and the second bonding pads 2 is not affected.

Figure 3:
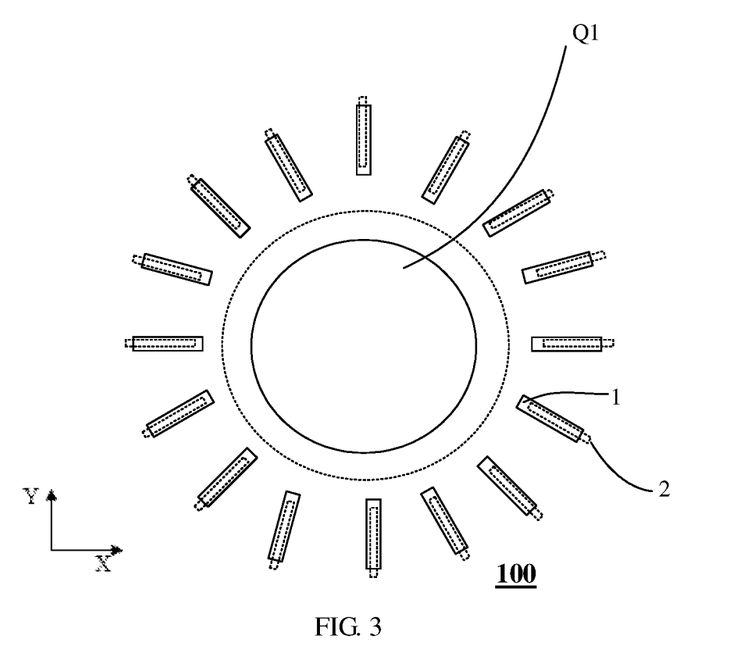
FIG. 3 is a schematic diagram of a position relationship between the array substrate deformed in a second case and a chip on film according to the first embodiment of the present disclosure.

As shown in FIG. 3, in a second case, the array substrate is uniformly deformed; when uniform inward shrinkage occurs, that is, a part of structures of the first bonding pads 1 on the array substrate are outwards misplaced relative to the second bonding pads 2 on the chip on film, but it is seen that the first bonding pads 1 and the second bonding pads 2 are annularly designed and the length directions thereof face the display area, such that the array substrate is uniformly deformed. Therefore, most structures of respective first bonding pads 1 are still bonded with the corresponding second bonding pads 2, thus, the bonding firmness between the first bonding pads 1 and the second bonding pads 2 is not affected.

Figure 4:
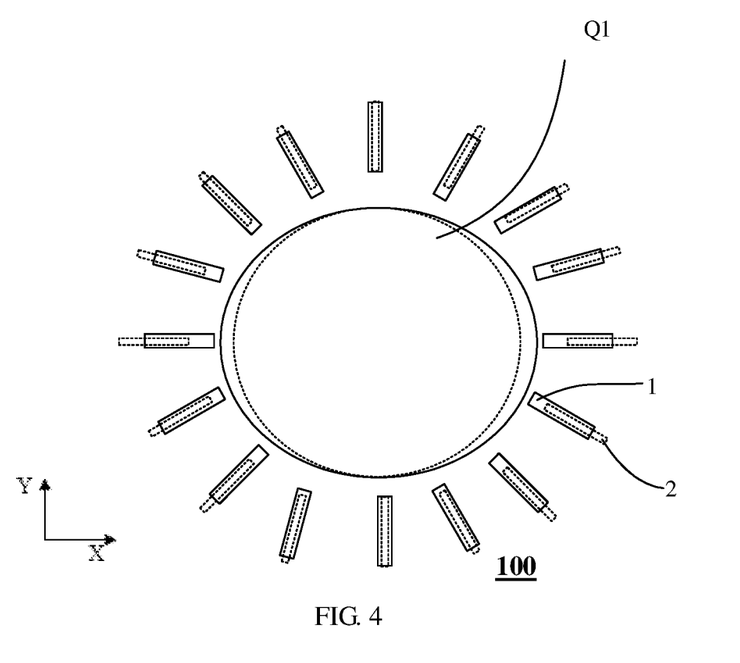
FIG. 4 is a schematic diagram of a position relationship between the array substrate deformed in a third case and a chip on film according to the first embodiment of the present disclosure.

As shown in FIG. 4, in a third case, the array substrate is nonuniformly deformed; when the array substrate is outwards expanded along an X direction (row direction), it is seen from the drawing that although the first bonding pads 1 and the second bonding pads 2 are misplaced in the X direction, most structures thereof are still bonded together; and even if the first bonding pads 1 and the second bonding pads 2 in other positions are misplaced, the misplacements are very small, and therefore, the bonding firmness between the first bonding pads 1 and the second bonding pads 2 is not affected.

Figure 5:
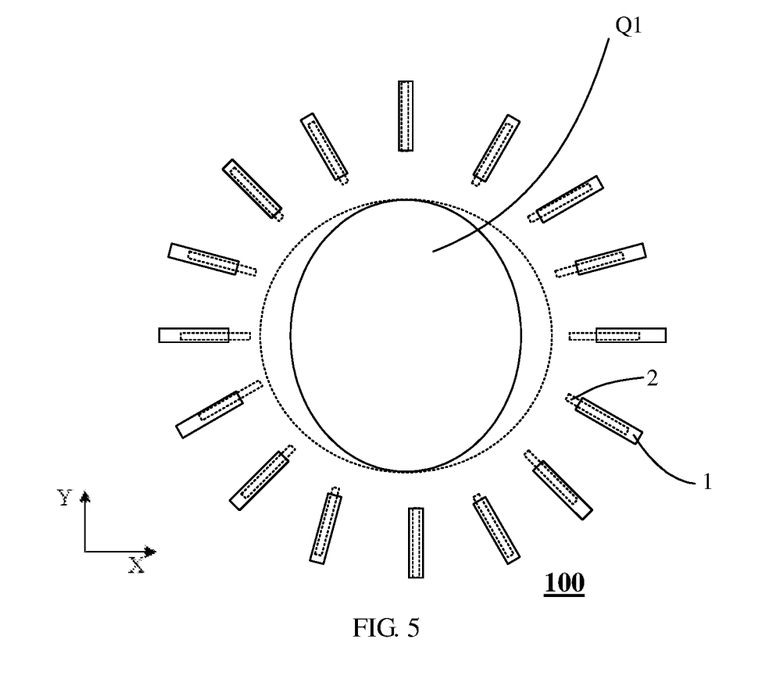
FIG. 5 is a schematic diagram of a position relationship between the array substrate deformed in a fourth case and a chip on film according to the first embodiment of the present disclosure.

As shown in FIG. 5, in a fourth case, the array substrate is nonuniformly deformed; when the array substrate is inwards shrunk along an X direction (row direction), it seen from the drawing that the first bonding pads 1 and the second bonding pads 2 are misplaced in the X direction, but most structures thereof are still bonded together; and even if the first bonding pads 1 and the second bonding pads 2 in other positions are misplaced, the misplacements are very small, and therefore, the bonding firmness between the first bonding pads 1 and the second bonding pads 2 is not affected.

Figure 6:
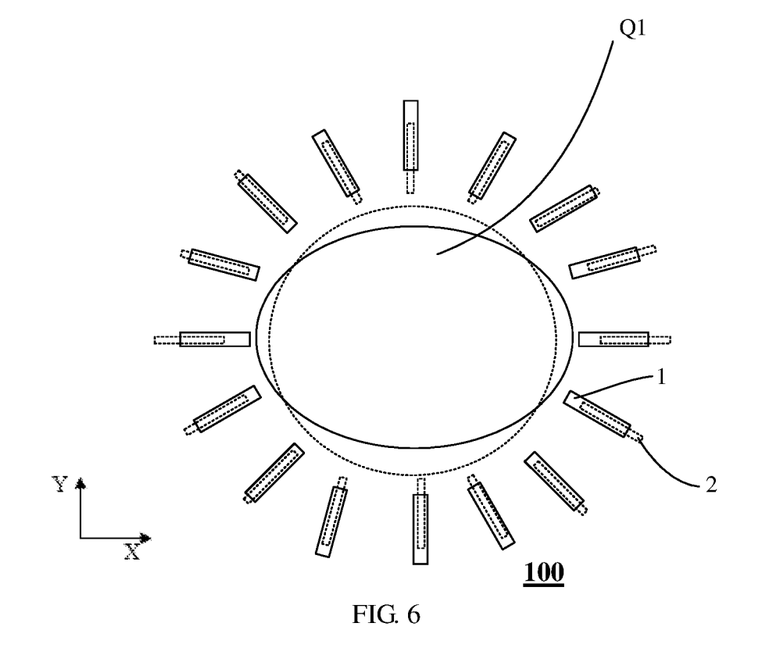
FIG. 6 is a schematic diagram of a position relationship between the array substrate deformed in a fifth case and a chip on film according to the first embodiment of the present disclosure.

As shown in FIG. 6, in a fifth case, the array substrate is deformed to different extents; for example, when the array substrate is outwards expanded along an X direction (row direction) and is inwards shrunk along a Y direction (column direction), it is seen from the drawing that the first bonding pads 1 and the second bonding pads 2 are misplaced in the X and Y directions, but most structures thereof are still bonded together; and even if the first bonding pads 1 and the second bonding pads 2 in other positions are misplaced, the misplacements are very small, and therefore, the bonding firmness between the first bonding pads 1 and the second bonding pads 2 is not affected.

It is noted that the dashed line positions in FIGS. 2 to 6 not only represent arrangement positions of the second bonding pads 2 but also represent the positions of the display area Q1 and the first bonding pads 1 of the array substrate when it is not deformed.

In the above examples, the display area Q1 of the display device is schematically shown as a circle for explanation; similarly, the shape of the display area Q1 can be a rectangle or any regular polygon, or can be any shape.

Besides, the present embodiment is particularly suitable for use in flexible display, that is, the base of the array substrate is prepared by adopting a flexible material, and therefore, the array substrate is flexible. Of course, the technical solution of the embodiment of the present disclosure is also suitable for common non flexible display devices.

The first bonding pads 1 on the array substrate and the second bonding pads 2 on the chip on film are uniformly arranged around the display area Q1. For example, distances between every two adjacent first bonding pads 1 are equal; and distances between every two adjacent second bonding pads 2 are equal. Such an arrangement manner is favorable for well bonding the first bonding pads 1 and the second bonding pads 2 together even if in a case of misplacement when the array substrate is deformed.

Figure 7:
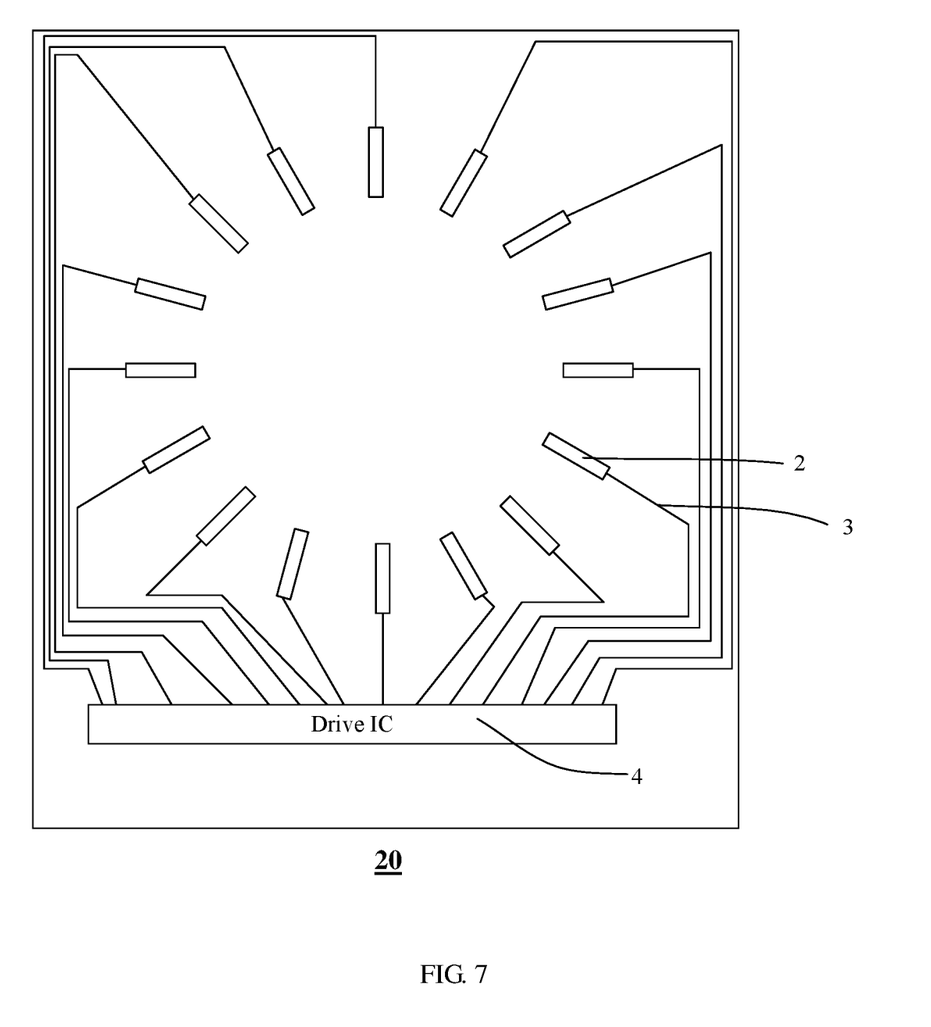
FIG. 7 is a schematic diagram of a chip on film with leads in a single side connection mode according to the first embodiment of the present disclosure.
Figure 8:
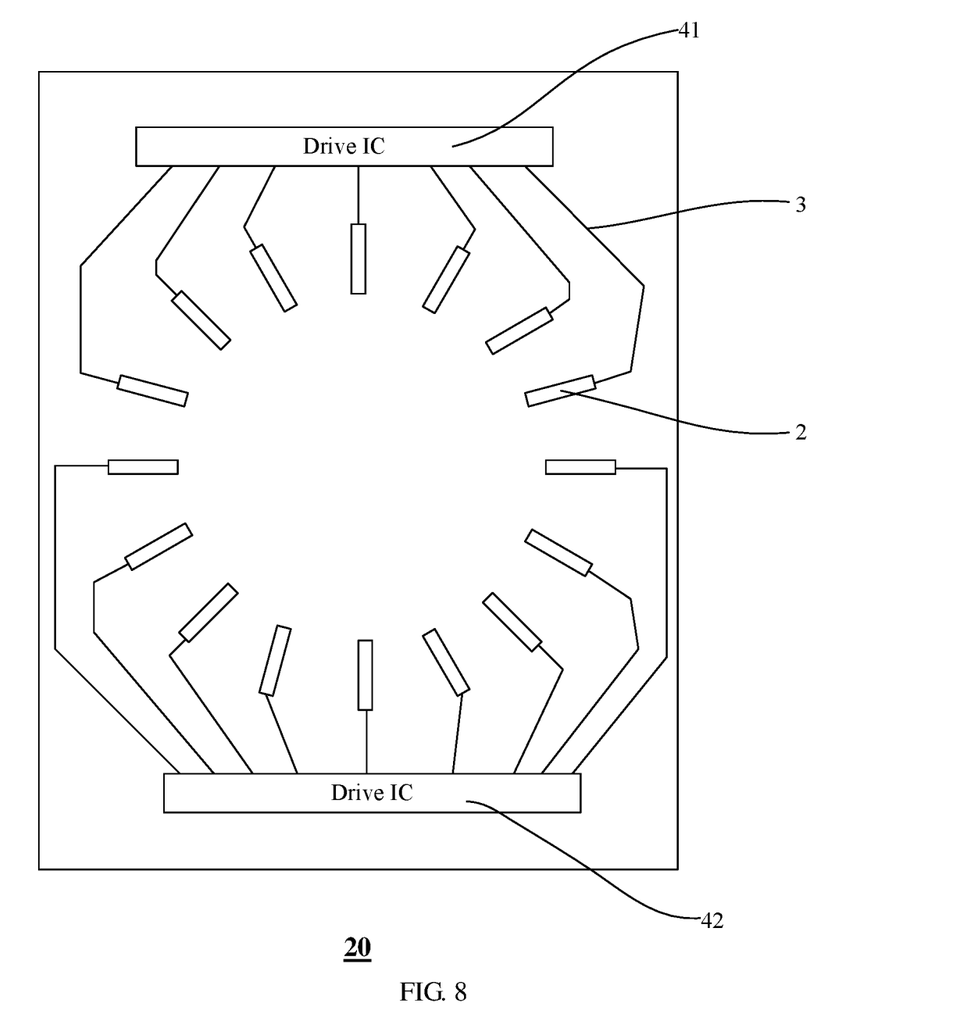
FIG. 8 is a schematic diagram that a chip on film with leads in a dual sides connection mode according to the first embodiment of the present disclosure.
Figure 9:
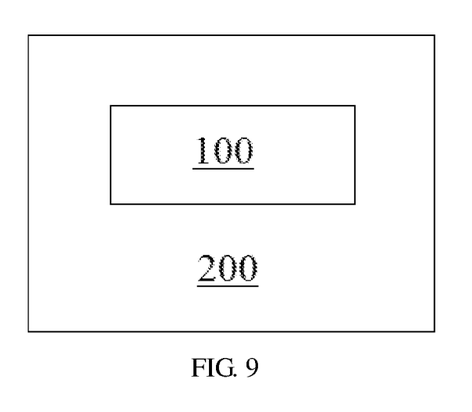
FIG. 9 is a schematic diagram of a display panel according to the first embodiment of the present disclosure.

Referring to FIGS. 7 and 8, the chip on film 20 is further provided with drive(s) (Drive IC) and a plurality of leads 3; one end of each lead 3 is connected to one second bonding pad 2, while the other end thereof is connected to one pin of the drive 4. The chip on film 20 can include one drive or can also include two drives 4. As shown in FIG. 7, when the chip on film 20 includes one drive 4, a connecting manner of the leads 3 is single side connection. As shown in FIG. 8, when the chip on film includes two drives, i.e., a first drive 41 and a second drive 42 opposite to each other, in this case, a part of the leads 3 are connected to the drive 41, the other part of the leads 3 are connected to the second drive 42, and a connecting manner of the leads 3 is a dual-side connection.

In the embodiment above, sufficient bonding positions can be ensured whether the array substrate is deformed in a manner of outward expansion or inward shrinkage, such that the first bonding pads and the second bonding pads can still be bonded together.

Second Embodiment

The present embodiment provides a display device, including the display panel in the first embodiment.

The display device can be any product or component having a display function, such as a liquid crystal display device, an OLED display device, electronic paper, a mobile phone, a flat computer, a television, a display, a laptop, a digital photo frame and a navigator.

The display device in the present embodiment has better yielding.

It is appreciated that the foregoing embodiments merely are exemplary embodiments in order to explain a principle of the present disclosure, but the present disclosure is not limited thereto, and changes or substitutions that are readily conceived by any skilled in the art without departing from the spirit and essence of the present disclosure should fall within the protective scope of the present disclosure.

The application claims priority of Chinese Patent Application No. 201610083954.2 filed on Feb. 6, 2016, the disclosure of which is incorporated herein by reference in its entirety as part of the present application.

The invention claimed is:

1. An array substrate, comprising a circle-shaped display area and a first bonding area located in a periphery of the display area to surround the display area, the array substrate comprising a plurality of first bonding pads located in the first bonding area, each of the plurality of first bonding pads has a rectangular surface, wherein
 the first bonding area includes two first sub-bonding areas each in a shape of semi-circular ring, the plurality of first bonding pads are respectively distributed in the two first sub-bonding areas in a shape of semi-circle and are arranged around the display area of the array substrate in a shape of circle, and in a circumferential direction, distances between every adjacent two of the first bonding pads are the same,
 length directions of the first bonding pads facing a center of a circle of the circle-shaped display area,
 one of the first bonding pads is located at a middle between an edge of the display area and an edge of the array substrate, and
 in the length direction of the one of the first bonding pads, the length of the one of the first bonding pads is larger than a half of a distance between the edge of the display area and the edge of the array substrate.

2. The array substrate according to claim 1, wherein the array substrate is flexible.

3. A chip on film, the film comprising a circle-shaped central area and a second bonding area located in a periphery of the central area to surround the central area, the film comprising a plurality of second bonding pads located in the bonding area, each of the plurality of second bonding pads has a rectangular surface, wherein
 the second bonding area includes two second sub-bonding areas each in a shape of semi-circular ring, and one side of each of the two second sub-bonding areas away from the central area is provided with one drive, two drives of the two second bonding areas are opposite to each other,
 the plurality of second bonding pads are respectively distributed in the two second sub-bonding areas in a shape of semi-circle and are arranged around the central area in a shape of circle,
 in a circumferential direction, distances between every adjacent two of the second bonding pads are the same,
 length directions of the second bonding pads facing a center of a circle of the circle-shaped central area,
 one of the second bonding pads is located at a middle between an edge of the central area and an edge of the film, and
 in the length direction of the one of the second bonding pads, the length of the one of the second bonding pads is larger than a half of a distance between the edge of the central area and the edge of the film, wherein
 the chip on film further comprises a plurality of leads, and each of the plurality of leads has one end connected to one of the second bonding pads and the other end connected to the drive in the second sub-bonding area where the second bonding pad is located, and wherein the plurality of leads are arranged to have no overlap with the central area, and the drives are arranged to have no overlap with the central area.

4. The chip on film according to claim 3, further comprising a first drive and a second drive opposite to each other, and a plurality of leads, wherein each of the second bonding pads is connected to one of the leads, a part of the leads are connected to the first drive and the other part of the leads are connected to the second drive.

5. The chip on film according to claim 3, further comprising a drive and a plurality of leads, wherein each of the second bonding pads is connected to one of the leads, and each of the leads is connected to the drive.

6. The chip on film according to claim 3, comprising a plurality of leads, wherein the drive comprises at least one pin,
 one end of one of the leads is connected to one of the second bonding pads, while the other end of the one of the leads is connected to one pin of the drive.

7. A display panel, comprising an array substrate and a chip on film, the array substrate including a plurality of first bonding pads disposed in a first bonding area surrounding a circle-shaped display area, the film including a plurality of second bonding pads disposed in a second bonding area surrounding a circle-shaped central area, the array substrate and the chip on film being bonded together by the first bonding pads and the second bonding pads, each of the plurality of first bonding pads and each of the plurality of second bonding pads have a rectangular surface, wherein
 the first bonding area includes two first sub-bonding areas each in a shape of semi-circular ring, the plurality of first bonding pads are respectively distributed in the two first sub-bonding areas in a shape of semi-circle and are arranged around the display area of the array substrate in a shape of circle, and in a circumferential direction, distances between every adjacent two of the first bonding pads are the same, a length direction of the first bonding pads faces a center of a circle of the circle-shaped display area of the array substrate, one of the first bonding pads is located at a middle between an edge of the display area and an edge of the array substrate, and in the length direction of the one of the first bonding pads, the length of the one of the first bonding pads is larger than a half of a distance between an edge of the display area and an edge of the array substrate, the second bonding area includes two second sub-bonding areas each in a shape of semi-circular ring, each of the two second sub-bonding areas is provided with one drive, and two drives of the two second bonding areas are opposite to each other; the plurality of second bonding pads are respectively distributed in the two second sub-bonding areas in a shape of semi-circle and are arranged around the central area of the film in a shape of circle; in a circumferential direction, distances between every adjacent two of the second bonding pads are the same, a length direction of the second bonding pads faces a center of a circle of the circle-shaped central area of the film, one of the second bonding pads is located at a middle between an edge of the central area and an edge of the film, and in the length direction of the one of the second bonding pads, the length of the one of the second bonding pads is larger than a half of a distance between an edge of the central area and an edge of the film, the chip on film further comprises a plurality of leads, and each of the plurality of leads has one end connected to one of the second bonding pads and the other end connected to the drive in the second sub-bonding area where the second bonding pad is located, wherein the plurality of leads are arranged to have no overlap with the central area, and the drives are arranged to have no overlap with the central area, and the plurality of second bonding pads and the plurality of first bonding pads are disposed in a one-to-one correspondence overlapping manner so that the first bonding pad or the second bonding pad completely covers the second bonding pad or the first bonding pad in both of the length direction or a width direction of the rectangular surface, and an area of the first bonding pad or the second bonding pad is greater than that of the second bonding pad or the first bonding pad.

8. A display device, comprising the display panel according to claim 7.

9. The display panel according to claim 7, wherein the chip on film comprises a plurality of leads, the drive comprises at least one pin, and wherein one end of one of the leads is connected to one of the second bonding pads, while the other end of the one of the leads is connected to one pin of the drive.

* * * * *